United States Patent
Jiang

(10) Patent No.: US 6,831,510 B2
(45) Date of Patent: Dec. 14, 2004

(54) CONTINUOUS LOW-FREQUENCY ERROR CANCELLATION IN A HIGH-SPEED DIFFERENTIAL AMPLIFIER

(75) Inventor: Jian Hong Jiang, Sunnyvale, CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 10/359,893

(22) Filed: Feb. 6, 2003

(65) Prior Publication Data

US 2004/0155705 A1 Aug. 12, 2004

(51) Int. Cl.[7] .................................................. H03F 1/36
(52) U.S. Cl. .......................................... 330/85; 330/310
(58) Field of Search ............................... 330/85, 124 R, 330/253, 259, 260, 295, 310

(56) References Cited

U.S. PATENT DOCUMENTS

| | | | |
|---|---|---|---|
| 3,958,185 A | 5/1976 | Hartung | 330/149 |
| 5,218,320 A * | 6/1993 | Albouy et al. | 330/85 |
| 5,341,249 A | 8/1994 | Abbott et al. | 360/46 |
| 5,430,765 A * | 7/1995 | Nagahori | 330/259 |
| 5,471,665 A * | 11/1995 | Pace et al. | 330/259 |
| 5,798,664 A * | 8/1998 | Nagahori et al. | 330/259 |
| 5,838,197 A | 11/1998 | Tsukuda | 330/252 |
| 6,169,638 B1 | 1/2001 | Morling | 360/46 |
| 6,288,604 B1 | 9/2001 | Shih et al. | 330/9 |
| 6,304,144 B1 | 10/2001 | Yamazaki et al. | 330/259 |
| 6,313,704 B1 | 11/2001 | Maruyama et al. | 330/259 |
| 6,316,992 B1 | 11/2001 | Miao et al. | 330/2 |
| 6,407,630 B1 | 6/2002 | Yao et al. | 330/9 |
| 6,674,328 B2 * | 1/2004 | Uto et al. | 330/259 |

* cited by examiner

Primary Examiner—Khanh Van Nguyen
(74) Attorney, Agent, or Firm—Baker Botts L.L.P.

(57) ABSTRACT

A signal processing module provides high-gain amplification of received signals, while canceling some or all low-frequency error in the received signal. The signal processing module includes a multi-stage amplification series and a low-frequency error cancellation feedback loop.

20 Claims, 2 Drawing Sheets

CONTINUOUS LOW-FREQUENCY ERROR CANCELLATION IN A HIGH-SPEED DIFFERENTIAL AMPLIFIER

TECHNICAL FIELD OF THE INVENTION

The present invention relates generally to high-speed communications and, more particularly, to continuous low-frequency error cancellation in a high-speed differential amplifier.

BACKGROUND OF THE INVENTION

Technological advances drive an ever increasing need for high capacity communications. To provide these capacities, designers strive for ever higher frequency transmissions. However, as frequencies increase, devices require more sophisticated and precise signal detection capabilities. Moreover, when distances are increased between communicating devices, a receiving device must account for low-level signals due to attenuation and increased distortion in transmitted signals.

SUMMARY OF THE INVENTION

In accordance with the present invention, techniques for continuous low-frequency error cancellation in a high-speed differential amplifier are provided. According to particular embodiments, these techniques enable the processing of high-frequency, frequency low-level signals to remove low-frequency errors.

According to a particular embodiment, a signal processing module includes multiple channel amplifiers, a low-pass filter, and an error amplifier. Each channel amplifier includes two signal inputs, two signal outputs, a supply voltage input, and a bias voltage input. The channel amplifiers form a series and each operate by receiving an input signal at the signal inputs, amplifying the input signal, and providing the amplified signal at the signal outputs. The low-pass filter receives the output signal from one of the channel amplifiers and provides filtered output to an error amplifier. During operation, the low-pass filter suppresses high-frequency components of the output signal to generate the filtered output. The error amplifier includes two signal inputs, two signal outputs, a supply voltage input, and a bias voltage input. The error amplifier receives the filtered output from the low-pass filter and provides an error cancellation signal from the signal outputs as feedback to the series of channel amplifiers.

Embodiments of the invention provide various technical advantages. These techniques help remove low-frequency errors, such as direct current (DC) offsets, from received signals and the DC offsets in the amplifier stages due to inherent device mismatches. Particular embodiments enable processing of very high-speed signals received with low-signal strength.

These techniques may further enable operation in accordance with various communication standards, while increasing the distances possible between communicating devices. For example, particular embodiments enable operation in accordance with XAUI standards, yet permit distances between devices to be measured in meters rather than centimeters.

Moreover, various embodiments achieve high-speed differential amplification with continuous low-frequency error cancellation using a single chip solution. For example, particular embodiments may be implemented using a single complementary metal oxide semiconductor (CMOS) device.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE DRAWINGS

Figure 1:
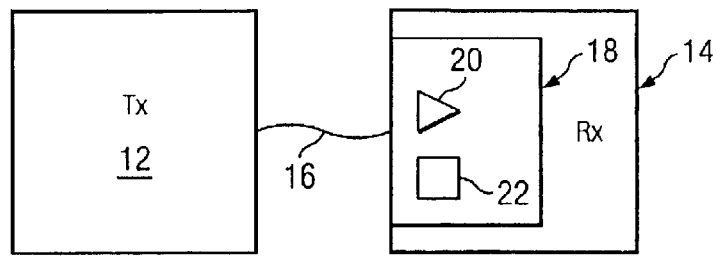
FIG. 1 illustrates a communications system having a receiver that operates according to particular embodiments of the present invention.

FIG. 1 illustrates a communications system, indicated generally at 10, that includes a transmitter 12 linked to a receiver 14 using a cable 16. Within receiver 14, incoming signals from cable 16 are handled by a signal processing module 18 that includes an amplification module 20 and an offset cancellation module 22. In general, transmitter 12 and receiver 14 provide for high-speed communications across cable 16. Within receiver 14, module 18 provides initial processing of received signals. In particular, module 18 amplifies received signals while performing low-frequency error cancellation to remove errors from the signals.

Transmitter 12 represents communications equipment, including controlling logic, for generating and transmitting high frequency communications signals. System 10 contemplates transmitter 12 working in conjunction with or being incorporated within any suitable devices. For example, transmitter 12 may implement transmission functionality for a computing device, network component, or other suitable equipment. Similarly, receiver 14 represents any suitable communications equipment, including controlling logic, for receiving and processing high frequency signals. Like transmitter 12, receiver 14 may work in conjunction with or be incorporated within any suitable device. Working together, transmitter 12 and receiver 14 enable high-speed communications across cable 16.

As noted, system 10 contemplates transmitter 12 and receiver 14 interconnecting any suitable devices. For example, multiple transmitters 12 and receivers 14 may be used to implement communications between elements of a distributed computing environment (such as an INFINI-BAND network), for office networking, and/or other suitable communications applications. According to particular embodiments, transmitter 12 and receiver 14 operate according to XAUI communication standards to allow high-speed ethernet communications. Thus, these elements potentially support transmissions at multi-gigabit per second frequencies.

Using module 18, receiver 14 can potentially handle low-level, high-frequency signals. While typical receivers stumble when faced with low-level signals, module 18 enables receiver 14 to handle these low-signal levels, for example, with voltage differentials below one hundred millivolts. Particular embodiments enable receiver 14 to process received signals with voltage differentials between two and eight millivolts or lower. This sensitivity permits relatively long-range communication of signals from transmitter 12 to receiver 14. Thus, for example, cable 16 may be over fifty meters in length, yet still support XAUI-compliant communications. However, while particular performance characteristics and examples are used above to illustrate the effectiveness of these techniques, system 10 contemplates using the techniques embodied within module 18 in any suitable communications scenario.

Figure 2:
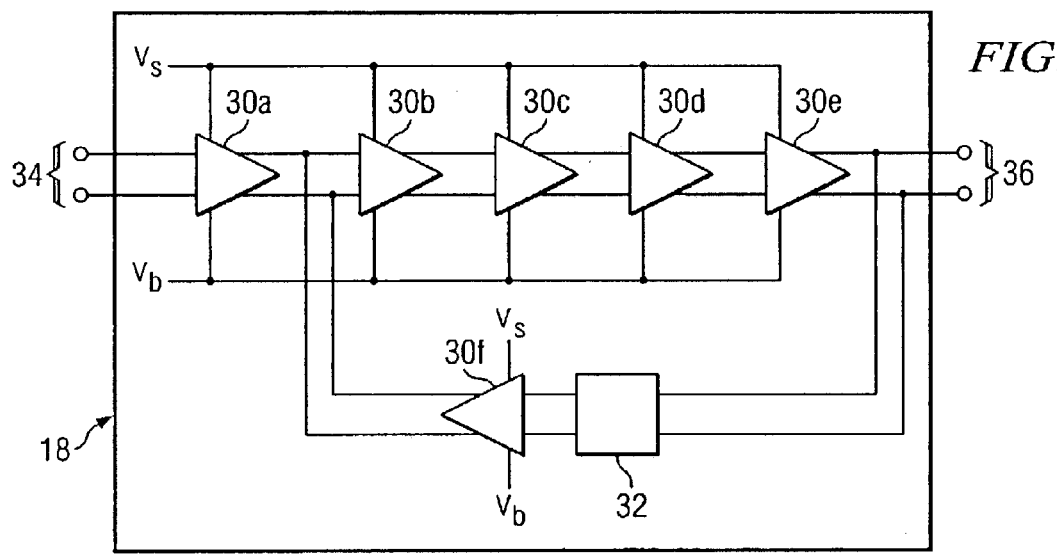
FIG. 2 is a block diagram illustrating components of an exemplary signal processing module from the receiver.

FIG. 2 is a block diagram illustrating exemplary functional components for signal processing module 18, which includes a number of amplifiers 30 and a filter 32. In the embodiment illustrated, a series of amplifiers 30, formed by amplifiers 30A, 30B, 30C, 30D and 30E, amplify signals received at input 34 to provide an amplified version of the input signal at output 36. Filter 32 extracts a low-frequency offset from the output of the amplifier series and provides this offset to offset amplifier 30F. Offset amplifier 30F feeds this amplified offset into the amplifier series to cancel the low-frequency errors in received signals. Therefore, in general, the arrangement of components within module 18 amplifies received signals while continuously canceling low-frequency errors using a feedback loop.

The components illustrated within module 18, including amplifier 30 and filter 32, each represent any suitable structure of circuit and/or logic elements configured to provide specific functionality. For example, each amplifier 30 includes a particular configuration of multiple transistor elements arranged to provide differential amplification. By arranging a number of amplifiers 30 in series, module 18 provides a multi-stage amplification series enabling amplification of low-level received signals.

Each amplifier 30 represents a circuit component for amplifying signals. In the embodiment illustrated, amplifier 30 includes two signal inputs, two signal outputs, a source voltage input, and a bias voltage input. Amplifier 30 amplifies the voltage differential between the two signal inputs and provides the amplified value as a voltage differential between the two signal outputs. Amplifier 30 provides this voltage differential within a range governed by the source voltage and the bias voltage. In the embodiment illustrated, a common source voltage ($V_s$) and bias voltage ($V_b$) are provided to each amplifier 30. According to particular embodiments, module 18 uses a bias voltage adjusted to bias outputs from amplifiers 30 into the upper half of the supply voltage. Given this type of biasing, all output is greater than the supply voltage divided by two. This type of biasing permits detected offsets to be directly fed to error amplifier 30F. Moreover, this biasing permits module 18 to feedback offsets without requiring voltage shifting.

Filter 32 represents a circuit component that receives an input signal, extracts a low-frequency error offset from the signal, and provide the extracted offset as an output. According to particular embodiments, filter 32 acts as a low-pass filter, such that high frequency signals are suppressed while low-frequency signals are passed on. For example, using a particular arrangement of transistors and resistors, filter 32 can act as an RC filter to extract low-frequency errors from a received signal. As previously discussed, receiver 14 expects to receive high-frequency data signals. Thus, in these received signals, the high-frequency components may be treated as data, while the low-frequency components may be treated as errors. Therefore, using filter 32 as a low-pass filter enables module 18 to extract the errors from amplified signals while suppressing the high-frequency data components.

During operation, module 18 receives an input signal at input 34. The signal amplification series, formed by amplifiers 30A, 30B, 30C, 30D, and 30E, amplifies the received signal and provides the amplified signal at output 36. As previously discussed, the received signal may include distortions, such as DC offset. DC offset represents a relatively constant, low-frequency distortion that shifts the values of received signals. For example, a two-millivolt DC offset can shift all received values by two millivolts. Given a large enough error, received signals may be shifted enough to prevent appropriate detection of the signal values. Thus, in addition to the amplification provided by the series of amplifiers 30, module 18 also attempts to cancel errors using filter 32 and offset amplifier 30F.

As previously discussed, filter 32 filters out the high-frequency components of the signal provided at output 36 to extract the low-frequency components. By extracting the low-frequency components, filter 32 isolates the low-frequency error within the amplified signal. Therefore, the result of this filtration provides an offset with substantially all of the received high frequency signal removed. Offset amplifier 30F amplifies the offset from filter 32 and provides the signal as an error cancellation signal into the series of amplifiers 30. In the embodiment illustrated, offset amplifier 30F provides the error cancellation signal at the input to the second amplifier of the series of amplifiers 30. However, module 18 contemplates offset amplifier 30F providing the error cancellation signal at any point within the series of amplifiers 30. The point at which the error cancellation signal is introduced may affect the amount of amplification required within offset amplifier 30F. For example, if offset amplifier 30F provides the error cancellation signal in the fourth stage amplifier 30 of the series as opposed to the second stage amplifier 30, an error cancellation signal may require higher amplification. Thus, the amount of amplification provided by offset amplifier 30F, including the number of amplification elements used to provide this amplification, may depend upon the point at which the error cancellation signal is introduced into the series of amplifiers 30.

When offset amplifier 30F introduces the error cancellation signal into the series of amplifiers 30, the error cancellation signal counteracts errors, such as DC offset, within received signals. For example, if received signals include a five-millivolt DC offset at the output of amplifier 30A, offset amplifier 30F may provide a negative five-millivolt signal at this point, which acts to cancel the DC offset in the received signal.

According to particular embodiments, module 18 may be implemented using elements incorporated within a single chip. For example, amplifiers 30 and filter 32 may be implemented using components of a metal oxide semiconductor chip. This enables the functionality of module 18 to be implemented as a portion of a chip that receives and processes high data rate signals. Moreover, one of skilled in the art will appreciate that the relatively small number of components used by module 18 to implement high gain amplification, accompanied by low-frequency error cancellation, provides significant advantages in designing, implementing, and incorporating module 18 into communications components.

While the embodiments illustrated and the preceding description focus on a particular embodiment of module 18 that includes specific elements, system 10 contemplates module 18 having any suitable combination and arrangement of elements providing a multi-stage amplification series and an error cancellation feedback loop. For example, while illustrated as including a five-stage amplifier series, module 18 may include any number of amplifiers 30 in series to provide amplification of received signals. Moreover, while illustrated with a filter and signal offset amplifier 30F, this error cancellation feedback loop may include any number of elements for isolating and/or amplifying errors from received signals. In addition, as previously discussed, the error cancellation loop may sample received signals at any point and introduce an error cancellation signal at any other point within the series of amplifiers 30.

Figure 3:
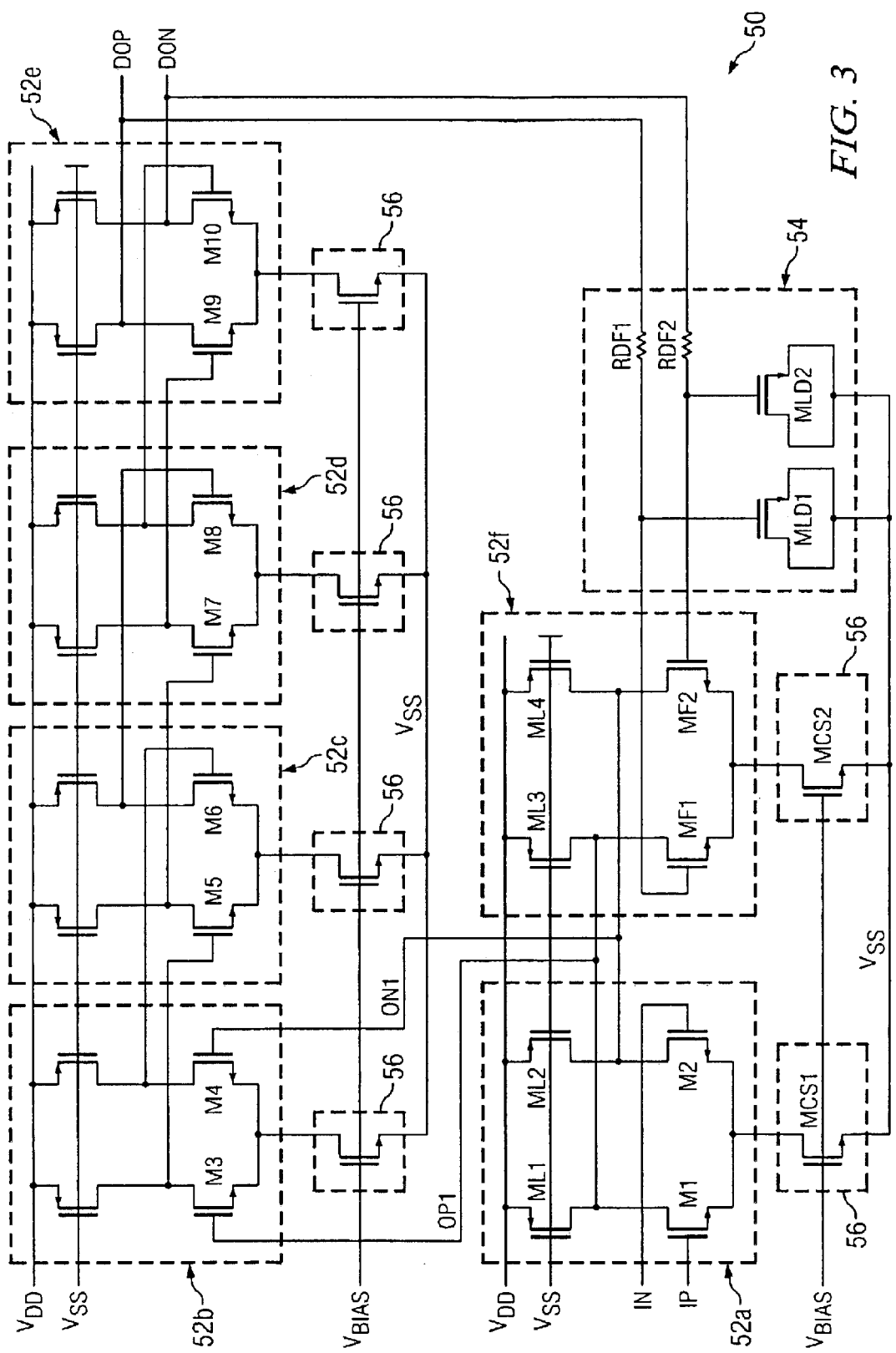
FIG. 3 is a circuit diagram illustrating a particular embodiment or the signal processing module.

FIG. 3 is a circuit diagram illustrating an exemplary layout, illustrated at 50, for implementing module 18. In the embodiment illustrated, layout 50 include components for implementing module 18 using complimentary metal oxide semiconductor chip technology. To implement the functionalities of module 18, layout 50 includes multiple amplifiers 52 and a filter 54. In addition, layout 50 includes multiple bias transistors 56, which correspond to each amplifier 52 and provide biasing of these amplifiers 52. In operation, these components provide for multi-stage amplification of a received signal and low-frequency error cancellation using a feedback loop.

As with the previous embodiment illustrated, layout 50 includes multi-stage amplification, implemented by amplifiers 52A, 52B, 52C, 52D and 52E. Each amplifier 52 acts as a differential amplifier using a particular configuration of transistors. Filter 54 includes a particular combination of transistors and resistors arranged to provide a low-pass filter. According to particular embodiments, filter 54 includes integrated resistor components, such as diffusion resistors, which can be implemented within a chip.

During operation, the multistage amplifier series amplifies received signals and provide the amplified signal as an output of layout 50. Filter 54 taps this amplified signal and suppresses high-frequency components of the tapped signal to isolate low-frequency errors. Amplifier 52F amplifies this detected offset and feeds the offset signal back into the multi-stage amplification.

Thus when operating, layout 50 receives an input signal at first stage amplifier 52A. As previously discussed, this input signal may include high-frequency data signals accompanied by low-frequency errors, such as DC offset. First stage amplifier 52A amplifies the received signal, and provides the received signal to second stage amplifier 52B. Second stage amplifier 52B receives this signal from first stage amplifier 52A and also receives the error cancellation signal generated by offset amplifier 52F. When combined with the signal from first stage amplifier 52A, the error cancellation signal acts to remove some or all of the low-frequency offset from the signal. The second through fifth stage amplifiers 52B, 52C, 52D and 52E then provide further amplification of the signal. Fifth stage amplifier 52E provides the resulting amplified signal as output. However, the amplified signal may contain errors, since the error cancellation signal provided by offset amplifier 52F may not cancel all of the low-frequency errors in received signals and these errors may shift over time. Thus, filter 54 attempts to continuously monitor the low frequency errors in the amplified signal provided by fifth stage amplifier 52E. This provides the continues feedback loop that acts to cancel some or all low-frequency errors in received signals.

Thus, as with the embodiment illustrated in FIG. 2, layout 50 provides a five-stage amplification with feedback of an error cancellation signal between the first and second stages. However, as with the previously illustrated embodiment, layout 50 provides only an exemplary circuit structure for implementing the concept described within this disclosure. Therefore, one of skill in the art will appreciate the virtually endless modifications possible without departing from the scope of these concepts.

Figure 4:
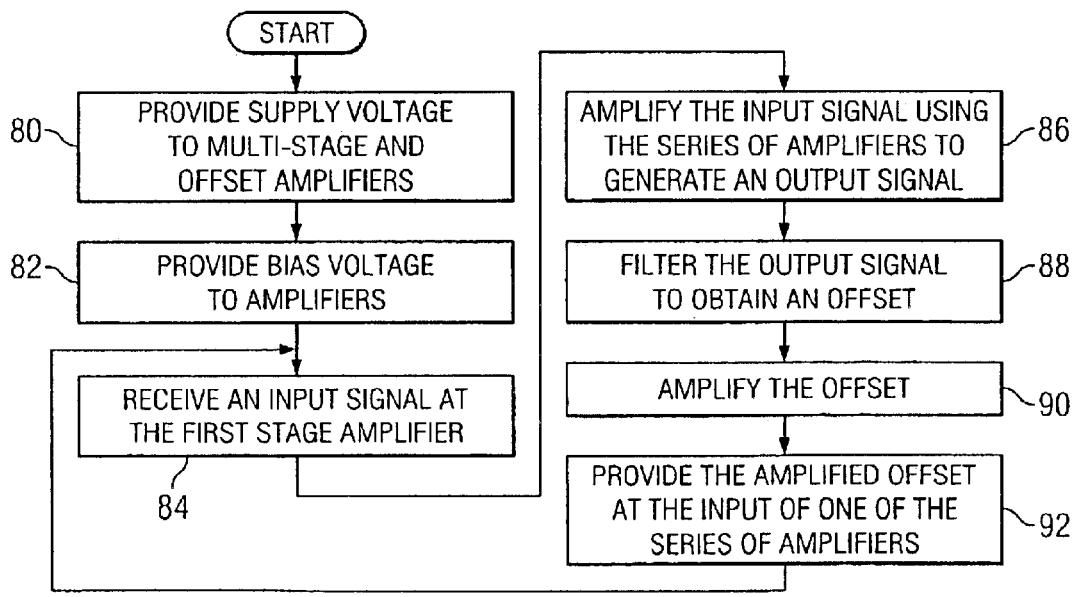
FIG. 4 is a flowchart illustrating a method for continuous low-frequency error cancellation in a high-speed differential amplification module.

FIG. 4 is a flowchart illustrating a method for amplifying a high-speed, low-strength signal while canceling low-frequency errors in the signal. While this method may be appropriate for use within any suitable communications component, the method is described below with respect to module 18. Module 18 provides a supply voltage to its amplifiers at step 80. This provides a voltage source ($V_s$) used by amplifiers 30 to amplify voltage differentials. For example, module 18 may provide a five-volt voltage source to power amplifiers 30. In addition to the supply voltage, module 18 provides a bias voltage to amplifiers 30 at step 82. According to particular embodiments, module 18 provides a bias voltage having a value that biases the amplifiers into the upper half of the supply range. For example, given a five-volt supply voltage, module 18 may provide a bias voltage to ensure that output of amplifiers 30 is greater than 2.5 volts.

Module 18 receives an input signal at the first stage of the series of amplifiers 30 at step 84 and amplifies the input signal using the cascaded stages of amplifiers 30 to generate an output signal at step 86. As previously discussed, this cascaded series of amplifiers 30 enables high gain amplification of received input signals to account for low-level signals. For example, as previously discussed, this series of amplifiers 30 may provide a twenty to forty-decibel amplification, enabling processing of low-level received signals.

In addition to the amplification, module 18 also provides the error cancellation feedback loop. Thus, module 18 filters the output signal to obtain an offset at step 88. For example, using filter 32, module 18 may suppress high frequency components to isolate the errors in the amplified output signal. Module 18 amplifies the offset from filter 32 at step 90 and provides the amplified offset at the input of one of the series of amplifiers 30 at step 92. This can effectively cancel a substantially large portion of low-frequency errors distorting received input signals. Therefore, this method provides for amplification of low-level, high-frequency received signals along with continuous cancellation of low-frequency errors in the received signals.

However, the preceding flowchart and accompanying description illustrate only an exemplary method of operation, and system 10 contemplates module 18 and/or other suitable components using any suitable techniques to provide amplification and low-frequency error cancellation. For example, the methods employed by module 18 may depend upon the configuration and arrangement of elements performing these functions. Also, many of the steps in this flowchart may take place simultaneously and/or in different orders than as shown. For example, while illustrated as distinct steps, module 18 may continuously receive signals, provide amplification of these signals, and provide an error cancellation feedback loop. In addition, while a relatively simple technique is illustrated in the preceding flowchart, module 18 may use methods with additional steps, fewer steps, and/or different steps, so long as the methods remain appropriate.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A signal processing module comprising:
a plurality of channel amplifiers each having two signal inputs, two signal outputs, a supply voltage input, and a bias voltage input, the channel amplifiers coupled in series and each operable to receive an input signal at the signal inputs, to amplify the input signal, and to provide the amplified signal at the signal outputs;
a low-pass filter coupled to receive the output signal from one of the channel amplifiers and coupled to provide filtered output to an error amplifier, the low-pass filter operable to suppress high-frequency components of the output signal to generate the filtered output; and
the error amplifier having two signal inputs, two signal outputs, a supply voltage input, and a bias voltage input, the error amplifier coupled to receive the filtered output from the low-pass filter at the signal inputs and coupled to provide an error cancellation signal from the signal outputs as feedback to the series of channel amplifiers.

2. The signal processing module of claim 1, further comprising a plurality of bias components each coupled to the bias voltage input of one of the series of channel amplifiers, the bias components operable to bias each of the channel amplifiers into an upper half of a supply voltage provided at the supply voltage input of each of the series of channel amplifiers.

3. The signal processing module of claim 1, wherein an input signal strength of a received signal at a first stage of the series of channel amplifiers is less than one hundred millivolts and a data rate of information transmitted in the received signal is greater than one gigabit-per-second.

4. The signal processing module of claim 1, wherein the signal processing module is implemented within a single integrated circuit, each of the channel amplifiers comprising a plurality of transistors, the filter comprising a plurality of transistors and resistors, and the error amplifier comprising a plurality of transistors.

5. The signal processing module of claim 1, wherein the signal processing module operates in compliance with XAUI communication standards and permits communications across transmission media at least ten meters in length.

6. The signal processing module of claim 1, wherein the series of channel amplifiers includes at least five stages, and the signal outputs of the error amplifier are coupled to the signal inputs of a second one of the channel amplifiers to provide the error cancellation signal as feedback between the first and second stages in the series.

7. A method for amplifying signals comprising:
receiving a signal at a first stage of a series of channel amplifiers having a plurality of amplifier stages;
amplifying the received signal at each stage of the series of channel amplifiers to generate an amplified signal as output from the final stage of the series of channel amplifiers;
tapping the amplified signal to obtain a tapped signal;
filtering the tapped signal to extract an error correction signal;
providing the error cancellation signal as feedback at a selected one of the stages;
combining the error cancellation signal with the received signal at the selected stage; and
providing the amplified signal as output.

8. The method of claim 7, further comprising:
providing a supply voltage to each of the channel amplifiers;
providing a bias voltage to each of the channel amplifiers to bias each of the channel amplifiers into an upper half of the supply voltage.

9. The method of claim 7, wherein an input signal strength of the received signal at the first stage of the series of channel amplifiers is less than one hundred millivolts and a data rate of information transmitted in the received signal is greater than one gigabit-per-second.

10. The method of claim 7, further comprising amplifying the error correction signal prior to providing the error correction signal as feedback.

11. The method of claim 7, wherein the received signal was transmitted in compliance with XAUI communication standards.

12. The method of claim 7, further comprising:
amplifying the received signal using at least five stages in the series of channel amplifiers; and
providing the error cancellation signal as feedback between the first and second stages in the series.

13. An integrated circuit comprising:
a plurality of channel amplifiers each comprising a plurality of transistors, each of the channel amplifiers having two signal inputs, two signal outputs, a supply voltage input, and a bias voltage input, the channel amplifiers coupled in series and each operable to receive an input signal at the signal inputs, to amplify the input signal, and to provide the amplified signal at the signal outputs;
a low-pass filter comprising a plurality of transistors and a plurality of diffusion resistors, the low-pass filter coupled to receive the output signal from one of the channel amplifiers and coupled to provide filtered output to an error amplifier, the low-pass filter operable to suppress high-frequency components of the output signal to generate the filtered output; and
the error amplifier comprising a plurality of transistors and having two signal inputs, two signal outputs, a supply voltage input, and a bias voltage input, the error amplifier coupled to receive the filtered output from the low-pass filter at the signal inputs and coupled to provide an error cancellation signal from the signal outputs as feedback to the series of channel amplifiers.

14. The integrated circuit of claim 13, further comprising a plurality of bias transistors each coupled to the bias voltage input of one of the channel amplifiers, the bias transistors operable to bias each of the channel amplifiers into an upper half of a supply voltage provided at the supply voltage input of each of the channel amplifiers.

15. The integrated circuit of claim 13, wherein an input signal strength of a received signal at a first stage of the series of channel amplifiers is less than one hundred millivolts and a data rate of information transmitted in the received signal is greater than one gigabit-per-second.

16. The integrated circuit of claim 15, wherein the input signal strength of the received signal is less than twenty millivolts.

17. The integrated circuit of claim 13, wherein the signal processing module is implemented within a single integrated circuit, each of the channel amplifiers comprising a plurality of transistors, the filter comprising a plurality of transistors and resistors, and the error amplifier comprising a plurality of transistors.

18. The integrated circuit of claim 13, further operable to operates in compliance with XAUI communication standards and to couple to a transmitter across transmission media at least ten meters in length.

19. The integrated circuit of claim 13, wherein the series of channel amplifiers includes at least five stages, and the signal outputs of the error amplifier are coupled to the signal inputs of a second one of the channel amplifiers to provide the error cancellation signal as feedback between the first and second stages in the series.

20. A signal processing module implemented within a single integrated circuit, the signal processing module comprising:

a signal processing input operable to receive a data signal having an input signal strength of less than one hundred millivolts and a data rate of information transmitted in the received data signal greater than one gigabit-per-second;

a plurality of channel amplifiers each having two signal inputs, two signal outputs, a supply voltage input, and a bias voltage input, the channel amplifiers coupled in series with the signal inputs of a first one of the channel amplifiers coupled to receive the data signal from the signal processing input, each channel amplifier operable to receive an input signal at the signal inputs, to amplify the input signal, and to provide the amplified signal at the signal outputs, the series of channel amplifiers operable to provide at least ten decibel amplification of the received data signal;

a plurality of bias components each coupled to the bias voltage input of one of the channel amplifiers, the bias components operable to bias each of the channel amplifiers into an upper half of a supply voltage provided at the supply voltage input of each of the channel amplifiers;

a low-pass filter coupled to receive the output signal from one of the channel amplifiers and coupled to provide filtered output to an error amplifier, the low-pass filter operable to suppress high-frequency components of the output signal to generate the filtered output; and the error amplifier having two signal inputs, two signal outputs, a supply voltage input, and a bias voltage input, the error amplifier coupled to receive the filtered output from the low-pass filter at the signal inputs and coupled to provide an error cancellation signal from the signal outputs as feedback to the series of channel amplifiers.

* * * * *

UNITED STATES PATENT AND TRADEMARK OFFICE
CERTIFICATE OF CORRECTION

PATENT NO.   : 6,831,510 B2
DATED        : December 14, 2004
INVENTOR(S)  : Jian Hong Jiang It is certified that error appears in the above-identified patent and that said Letters Patent is hereby corrected as shown below:

Column 1,
Line 28, after "high-frequency" delete "frequency".

Signed and Sealed this

Thirty-first Day of January, 2006

JON W. DUDAS
*Director of the United States Patent and Trademark Office*